(12) United States Patent
Jung et al.

(10) Patent No.: US 6,319,825 B1
(45) Date of Patent: Nov. 20, 2001

(54) METALLIZATION PROCESS OF SEMICONDUCTOR DEVICE

(75) Inventors: Byung Hyun Jung, Seoul; Heui Bok Ahn, Kyoungki-do, both of (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 09/310,820

(22) Filed: May 12, 1999

(51) Int. Cl.[7] ............................................. H01L 21/4763
(52) U.S. Cl. .................. 438/642; 438/625; 438/687; 438/688
(58) Field of Search .................... 438/597, 618, 438/625, 627, 628, 629, 630, 636, 642, 643, 644, 645, 652, 653, 658, 660, 661, 663, 687, 688

(56) References Cited

U.S. PATENT DOCUMENTS

| | | |
|---|---|---|
| 5,035,754 | 7/1991 | Sakiyama et al. . |
| 5,534,463 * | 7/1996 | Lee et al. ................ 438/643 |
| 5,711,858 | 1/1998 | Kontra et al. . |
| 5,747,360 * | 5/1998 | Nulman ................ 438/648 |
| 5,913,146 * | 6/1999 | Merchant et al. ................ 438/646 |

FOREIGN PATENT DOCUMENTS 95-10039   9/1995   (KR) .

* cited by examiner

Primary Examiner—Carl Whitehead, Jr.
Assistant Examiner—Jeff Vockrodt
(74) Attorney, Agent, or Firm—Andrus, Sceales, Starke & Sawall

(57) ABSTRACT

A metallization process of a semiconductor device is disclosed. The metallization process of a semiconductor device comprising the steps of: providing a semiconductor substrate having a junction region; forming an insulating layer on the upper of the semiconductor substrate; forming a contact hole by patterning the insulating layer so as to expose one portion of the junction region; forming a glue layer on the upper of the insulating layer, and at the bottom and inner surfaces of the contact hole; forming a barrier metal layer on the glue layer; forming an Mg layer as a solid solution layer on the barrier metal layer; forming a metal layer on the Mg layer; and forming a metal wiring layer having more liquidity than that of the metal layer, by melting the Mg layer to the metal.

29 Claims, 8 Drawing Sheets

400

METALLIZATION PROCESS OF SEMICONDUCTOR DEVICE

FIELD OF THE INVENTION

The present invention relates to a metallization process of a semiconductor device, more particularly to a metallization process capable of improving reliability in the metallization.

BACKGROUND OF THE INVENTION

Referring to FIG. 1, a conventional metallization process of semiconductor device will be discussed.

An intermediate insulating layer 12 is formed on a semiconductor substrate 10 having a junction region 11. And then, a contact hole H is formed by etching the intermediate insulating layer 12 so as to expose a predetermined portion of the junction region 11. A first Ti layer 13 as a glue layer is deposited on the intermediate insulating layer 12 and at bottom and inner surfaces of the contact hole H, and successively a first TiN layer 14 as a barrier metal is deposited by a sputtering technology. Herein, the first Ti layer 13 serves for improving the adhesive characteristics between the surface of semiconductor substrate 10, the intermediate insulating layer 12 and the first TiN layer 14. The barrier metal, i.e. the first TiN layer 14 restrains electromigration between the semiconductor substrate 10 and a metal wiring layer to be formed later thereby preventing junction spiking in the junction region 11. Afterward, the Rapid Thermal Annealing(RTA) is performed and then, a titanium silicide layer 13a is formed at an interface of the junction region 11 and the first Ti layer 13. Next, a second Ti layer 15 as a glue layer is deposited on the top surface of the first TiN layer 14. Herein, the second Ti layer 15 serves for improving the adhesive characteristics between a metal wiring layer to be formed later and the first TiN layer 14. A metal wiring layer 16 is formed on the second Ti layer 15. To prevent silicon atoms' migration from the junction region 11 to metal wirings, an alloy layer of aluminum with silicon can be used for the metal wiring layer 16. A second TiN layer 17 as an anti-reflective coating layer is formed on the metal wiring layer 16.

When a predetermined heat, for example at temperature of above 35° C., is applied to the second Ti layer 15 and the metal wiring layer 16, they easily react each other and a $TiAl_3$ compound 15a is precipitated therebetween. At this time, the $TiAl_3$ compound 15a has a high resistance that increases the resistance in the metal wirings, which also causes signal delays in semiconductor device. Furthermore, some portions of the metal wiring layer 16 are left behind thereby increasing current density. Accordingly, reliability in the metallization is degraded.

Also, as the semiconductor device is getting integrated, the contact size becomes smaller. Accordingly, it is difficult for the aluminum layer formed by the sputtering technology to fill up the narrow inner space of the contact region H. Therefore, a void is formed or the metal wiring layer is disconnected within the contact hole H.

Furthermore, when the aluminum alloy layer with silicon is used as a metal wiring layer for preventing the electromigration, silicon atoms in the alloy layer are precipitated in the shape of silicon nodule during sequential annealing processes. For the above reasons, reliability in the metallization is degraded.

SUMMARY OF THE INVENTION

Accordingly, one object of the present invention is to improve the conductive characteristics in the metallization and obtain the reliability therein.

The other object of the invention is to fill up the fine contact hole with the metal wirings easily.

So as to accomplish the above objects, the present invention includes the steps of: providing a semiconductor substrate having a junction region; forming an insulating layer on the upper of the semiconductor substrate; forming a contact hole by patterning the insulating layer so as to expose one portion of the junction region; forming a glue layer on the upper of the insulating layer, and at the bottom and the inner surfaces of the contact hole; forming a barrier metal layer on the glue layer; forming an Mg layer as a solid solution layer on the barrier metal layer; forming a metal layer on the Mg layer; and forming a metal wiring layer having more liquidity than that of the metal layer, by melting the Mg layer to the metal layer.

The present invention further includes the steps of: providing a semiconductor substrate having a junction region; forming an insulating layer on the upper of the semiconductor substrate; forming a contact hole by patterning the insulating layer so as to expose one portion of the junction region; forming a glue layer on the upper of the insulating layer, and at the bottom and the inner surfaces of the contact hole; forming a barrier metal layer on the glue layer; and forming an Mg layer as a solid solution layer on the barrier metal layer; forming a metal layer on the Mg layer, wherein the step of forming the Mg layer further comprises a step of depositing some portions of the metal layer at a selected thickness under a first temperature condition and a step of depositing the metal layer and simultaneously melting the Mg layer to the metal layer by depositing the rest of selected thickness under a second temperature condition, the first temperature is lower than the second temperature.

The present invention further includes the steps of: providing a semiconductor substrate having a junction region; forming an insulating layer on the upper of the semiconductor substrate; forming a contact hole by patterning the insulating layer so as to expose one portion of the junction region; forming a glue layer on the upper of the insulating layer, and at the bottom and the inner surfaces of the contact hole; forming a barrier metal layer on the glue layer; forming a metal layer on the barrier metal layer; forming an Mg layer as a solid solution layer on the metal layer; and forming a metal wiring layer having more liquidity than that of the metal layer, by melting the Mg layer to the metal layer.

The present invention further includes the steps of: providing a semiconductor substrate having a junction region; forming an insulating layer on the upper of the semiconductor substrate; forming a contact hole by patterning the insulating layer so as to expose one portion of the junction region; forming a glue layer on the upper of the insulating layer, and at the bottom and inner surfaces of the contact hole; forming a barrier metal layer on the glue layer; forming a metal layer on the barrier metal layer; and forming an Mg layer as a solid solution on the metal layer, wherein the Mg layer is deposited at a temperature that the Mg is meltable to the metal layer in the step of forming the Mg layer.

The present invention further includes the steps of: providing a semiconductor substrate having a junction region; forming an insulating layer on the upper of the semiconductor substrate; forming a contact hole by patterning the insulating layer so as to expose one portion of the junction region; forming a glue layer on the upper of the insulating layer, and at the bottom and the inner surfaces of the contact hole; forming a barrier metal layer on the glue layer; forming a first metal layer on the barrier metal layer; forming an Mg layer on the first metal layer; forming a second metal layer on the Mg layer; and forming a metal wiring layer having more liquidity than that of the metal layers, by melting the Mg layer to the first and the second metal layers.

DETAILED DESCRIPTION OF PREFERRED EMBODIMENTS

Hereinafter, the best modes for carrying out the present invention are given by attaching with the drawings.

[First Embodiment]

Figure 1:
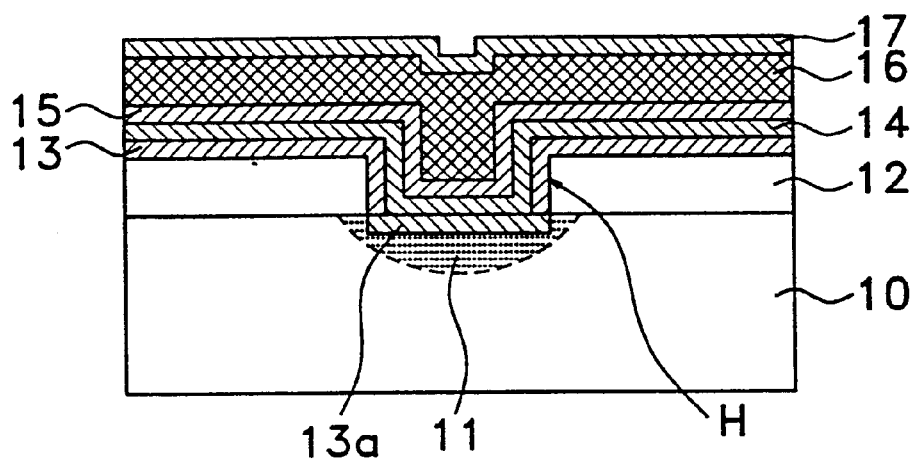
FIGS. 1 and 2 are cross-sectional views for showing the conventional metallization in semiconductor device.
Figure 2:
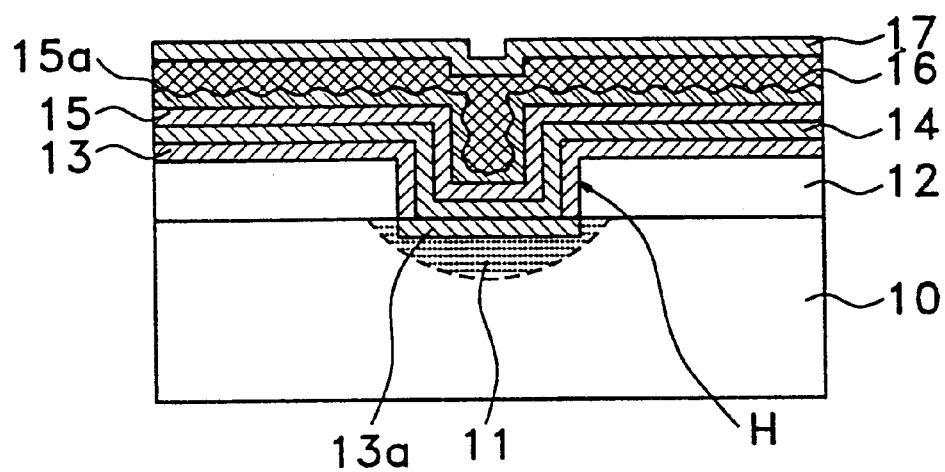
Figure 3A:
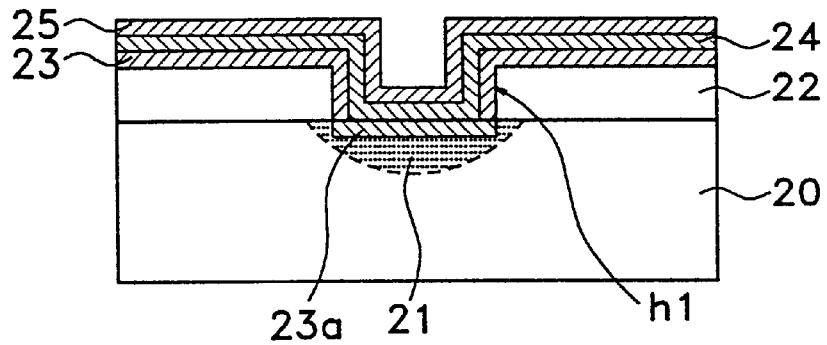
FIGS. 3A to 3D are cross-sectional views for showing the metallization process of semiconductor device according to the first embodiment of the present invention.

Referring to FIG. 3A, a semiconductor substrate 20 of a first conductivity having a second conductivity type junction region 21 is provided. An intermediate insulating layer 22 is deposited on the semiconductor substrate 20 and some portions of the intermediate insulating layer 22 is etched so as to expose a predetermined portion of the junction region 21, thereby forming a contact hole h1. A Ti layer 23 as a glue layer is formed on the intermediate insulating layer 22 and at the bottom and inner surfaces of the contact hole h1 by a known sputtering technology. And then, a first TiN layer 24 as a barrier metal layer for preventing electromigration is formed on the upper of the Ti layer 23. Afterward, an Mg layer 25 is deposited by a known sputtering technology likewise a physical vapor deposition (hereinafter "PVD") method. Generally, the size of Mg atom is almost same to Al or Cu and has less resistivity. Moreover, the crystalline structure of Mg, i.e. hexagonal closed-packed (HCP) is similar to that of Al, i.e. face-centered cubic (FCC), it is easy to grow continuously together with Al and Cu. Consequently, applying a predetermined temperature, Mg is easily melted to Al or Cu and the melted Mg lowers the melting point of Al or Cu without incurring changes in resistivity. Further, when Mg is melted in Al or Cu, the liquidity of Al or Cu is increased and which simplifies the filling of a fine contact hole. Additionally, the melting point of Al or Cu is lowered so that the filling of the fine contact hole is further simplified. Herein, the Mg layer 25 is preferably deposited at thickness of approximately 30 to 40% of a metal layer to be formed later, i.e. in the range of 100 to 300 Å. At an interface of the Ti layer 23 and the junction region 21, a titanium silicide layer 23a is formed by the reaction of Ti and Si.

Figure 3B:
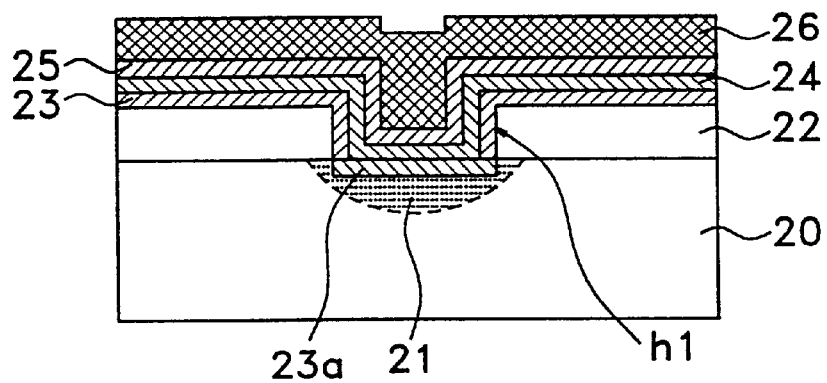

Next, as shown in FIG. 3B, a metal layer 26 of highly conductive material, such as Al, or an alloy layer having Al with Si or Cu is deposited on the Mg layer 25 at thickness of 3000 to 10000 Å by a sputtering technology such as PVD method.

Figure 3C:
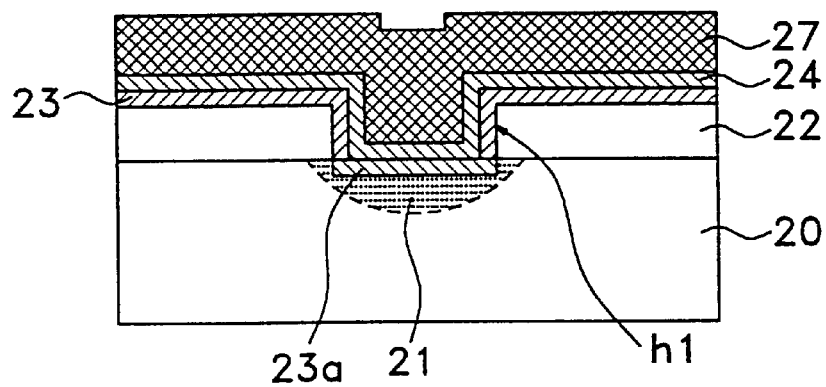

Afterward, as shown in FIG. 3c, a resultant structure on the semiconductor substrate 20 is annealed at a predetermined temperature. According to this annealing process, Mg contained in the Mg layer 25 is melted to the metal layer 26 and the metal wiring layer 26 is accomplished. At this time, the melting point in the metal wiring layer 27 is lower than that in the metal layer 26 according to melting Mg to the metal wiring layer 26.

The following table 1 shows the melting points of the metal layer 26 and Mg melted metal wiring layer 27.

TABLE 1

|    | Melting Points -Not Including Mg | Melting Points -Including Mg |
|----|-----------------------------------|------------------------------|
| Al | 660° C.                           | 450° C.                      |
| Cu | 1083° C.                          | 722° C.                      |

According to the table 1, it is noted that the melting point in case of including Mg is remarkably lower than that in case of not including Mg. As shown in the above, the annealing process is preferably performed at the lowered temperature by melting Mg. That means, for example, when Al is used as the metal layer, the annealing process is performed at the temperature range of 400 to 500° C., and when Cu is used as the metal layer, the annealing process is performed at the temperature range of 650 to 750° C.

Moreover, when Mg is melted to Al or Cu, the melting point of the metal wiring layer is lowered, the liquidity of Al or Cu is increased, and finally no void is formed or the metal wiring layer is not disconnected within the fine contact hole.

As known from the above, when melting point of metal wiring layer 27 is lowered, the liquidity of metal wiring layer is increased and the filling-up characteristics in the fine contact hole is also improved. Furthermore, when the metal layer 26 and the Mg layer 25 are reacted, the compound $MgAl_3$ or $MgCu_2$ is generated. These compounds are coupled with vacancies generated by electromigration thereby preventing vacancies' movement.

Further, when an alloy layer of Al with Si is used as the metal layer, Si in the alloy layer is reacted with Mg and $Mg_2Si$ is precipitated. At that time, the silicon nodule generated in Al-Si alloy metal layer is removed by the $Mg_2Si$ compounds.

Figure 4:
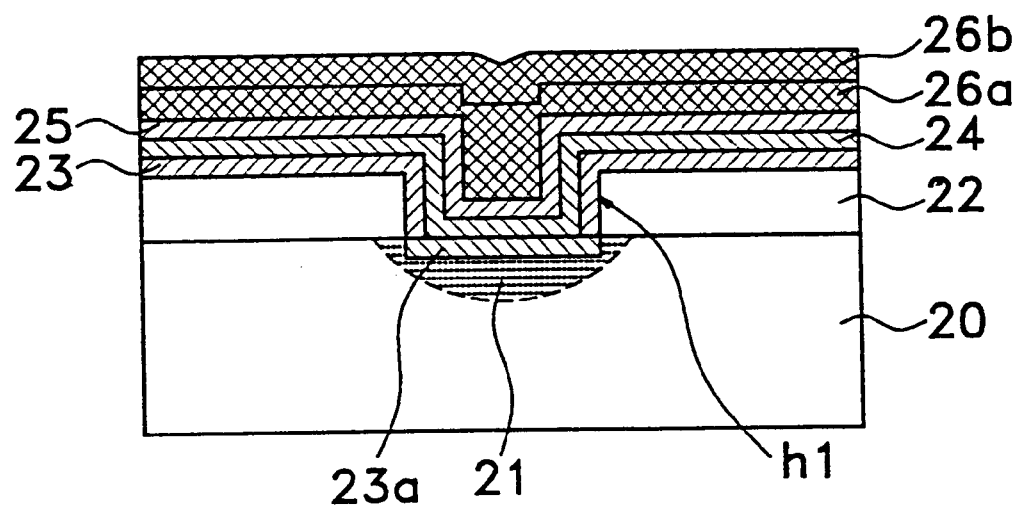
FIG. 4 is a cross-sectional view for showing another metallization process according to one modification of the first embodiment of the present invention.

As shown in FIG. 4, while forming the metal layer, a first metal layer 26a is deposited on the Mg layer 25 at thickness of half the metal layer, preferably in the range of 1500 to 5000 Å. At this time, the first metal layer 26a is deposited at below 100° C. which is the temperature having no affect on the melting point.

And next, a second metal layer 26b is deposited on the first metal layer 26a. Herein, the second metal layer 26b is deposited at a high temperature, preferably at the melting point when Mg is melted to Al or Cu. Accordingly, the metal layers are deposited and simultaneously Mg is melted to the metal layers 26a, 26b thereby obtaining the metal wiring layer 27 as shown in FIG. 3c.

Figure 3D:
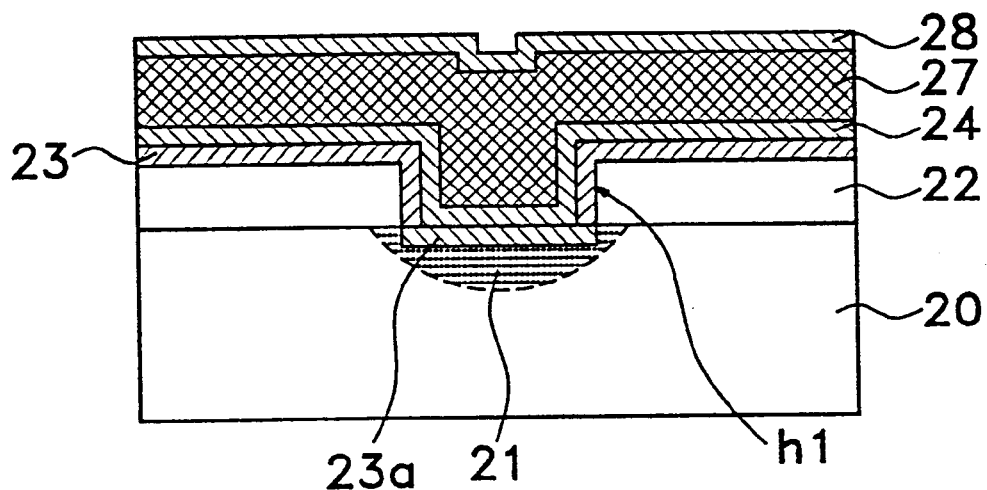

Afterward, as shown in FIG. 3d, a second TiN layer 28 as an anti-reflective coating layer is deposited on the metal wiring layer 27. The anti-reflective coating layer as noted, prevents reflection of light irradiated on metal in sequential photolithography process and serves to form a precise pattern.

According to the present invention, after forming the Mg layer at the bottom of the metal layer, a metal wiring layer 27 having a lower melting point is formed by melting the Mg layer 25 within the metal layer. The metal wiring layer are easily filled up in the fine contact hole since Mg is included therein. Furthermore, the compound $MgAl_3$ or $MgCu_2$ is generated. These compounds are coupled with vacancies generated by electromigration thereby preventing the vacancies' movement.

Since the metal layer 26 is not contacted with the Ti layer 23 as the glue layer, the compound such as $TiAl_3$ is not generated at boundary of the metal layer 26. Accordingly, the conduction characteristic of metal wiring layer 27 is improved.

In the present embodiment, the Ti layer is used as a glue layer and the TiN layer is used as a barrier metal layer. However, other material having the same characteristics with the above can be used.

[Second Embodiment]

Figure 5A:
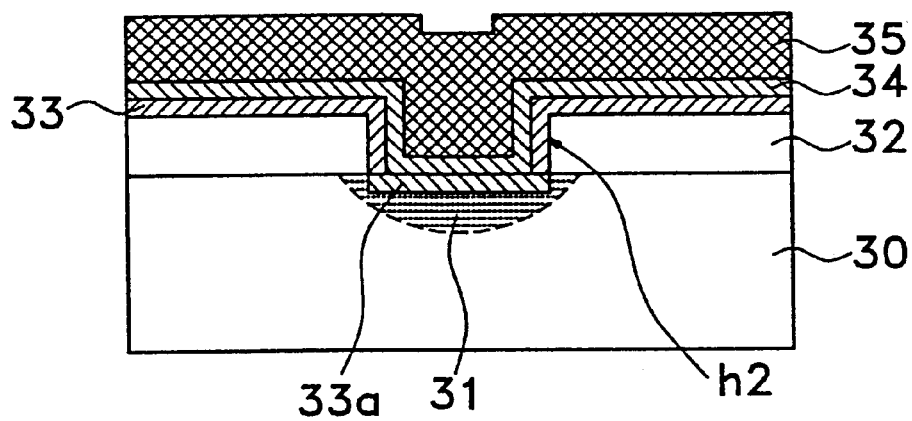
FIGS. 5A to 5D are cross-sectional views for showing the metallization process of semiconductor device according to the second embodiment of the present invention.

Referring to FIG. 5A, a semiconductor substrate 30 of a first conductivity having a second conductivity type junction region 31 is provided. An intermediate insulating layer 32 is deposited on the semiconductor substrate 30 and some portions of the intermediate insulating layer 32 is etched so as to expose a predetermined portion of the junction region 31, thereby forming a contact hole h2. A Ti layer 33 as a glue layer is formed on the intermediate insulating layer 32 and at the bottom and inner surfaces of the contact hole h2 by a known sputtering technology. And then, a first TiN layer 34 as a barrier metal layer for preventing electromigration is formed on the upper of the Ti layer 33. At an interface of the Ti layer 33 and the junction region 31, a titanium silicide layer 33a is formed by the reaction of Ti and Si. A metal layer 35 of highly conductive metal such as Al or Cu is deposited on the first TiN layer as a barrier metal layer at thickness range of 3000 to 10000 Å by a known sputtering technology likewise the PVD method.

Figure 5B:
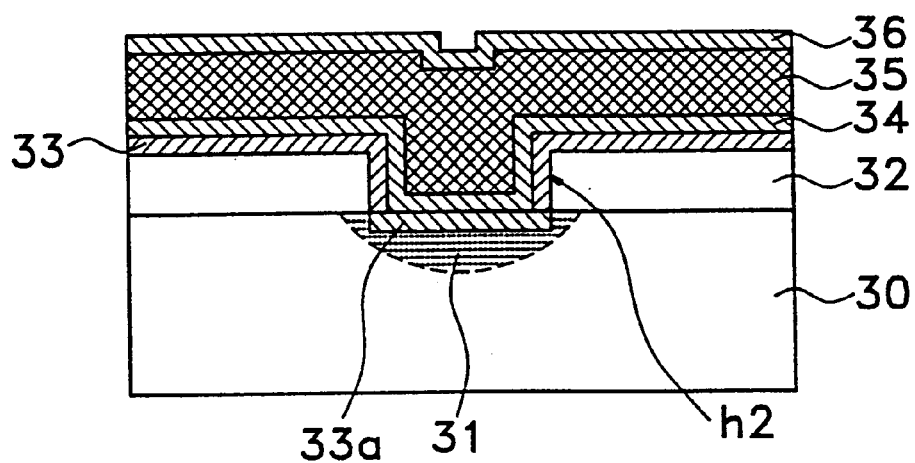
Figure 5C:
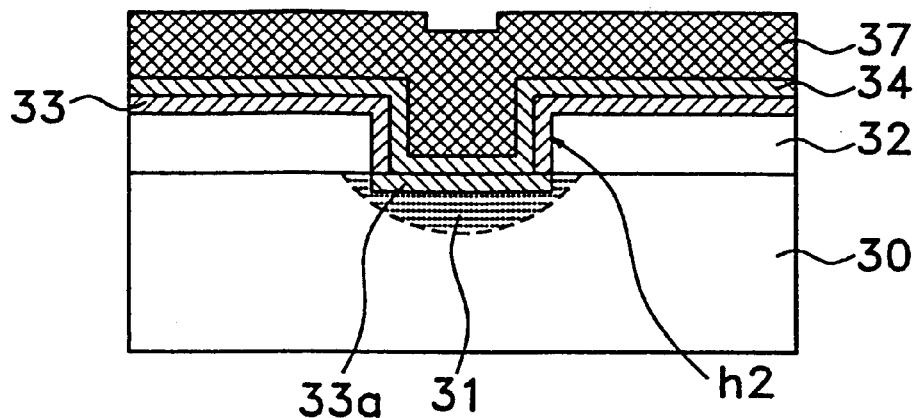

Next, referring to FIG. 5B, an Mg layer 36 as a solid solution layer is deposited on the metal layer 35 by the sputtering technology likewise the PVD method. At this time, the Mg layer 36 is preferably deposited at thickness of approximately 30 to 40% of the metal layer 35, i.e. in the range of 100 to 300 Å. When Al is used as the metal layer 35, the annealing process is performed at the temperature range of 400 to 500° C., and when Cu is used as the metal layer 35, the annealing is performed at the temperature range of 650 to 750° C. And then, as shown in FIG. 5C, a metal wiring layer 37 is formed by melting Mg of the Mg layer 36 to the metal layer 35. At this time, the melting point of the metal wiring layer 37 is lowered by a predetermined degree due to the solid solution of Mg, and the liquidity thereof is increased. Therefore, a metal wiring layer is easily filled up in the fine contact hole.

The Mg deposition and annealing process can be performed simultaneously when the Mg layer 36 is deposited at the annealing temperature of 400 to 500° C. in case Al is used for the metal layer, or at the annealing temperature of 650 to 750° C. in case Cu is used for the metal layer.

Figure 5D:
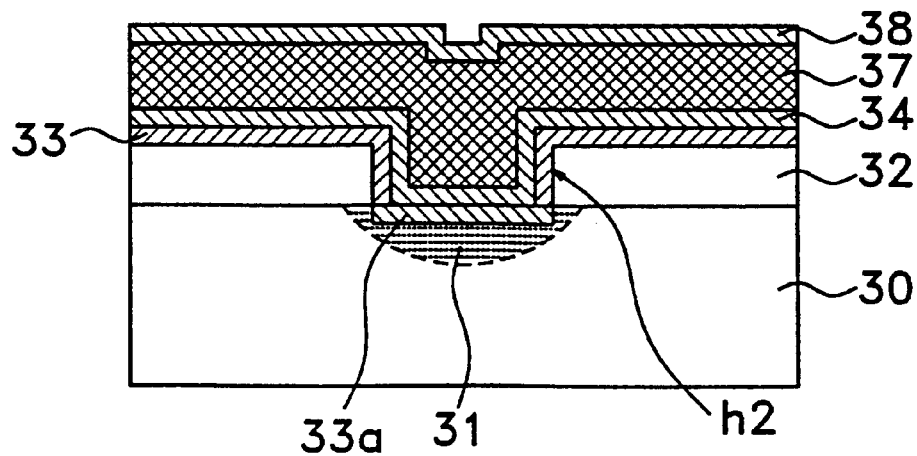

Afterward, as shown in FIG. 5D, a second TiN layer 38 as an anti-reflective coating layer is deposited on the metal wiring layer 37.

The same result as that of the first embodiment is obtainable when the Mg layer 36 is deposited on the metal layer 35. Also, the Mg deposition and the annealing process are performed simultaneously since the Mg layer 36 is deposited at the temperature of annealing.

Since the metal layer 35 is not contacted with the Ti layer 33 as the glue layer, the compound such as $TiAl_3$ is not generated at boundary of metal layer 35. Accordingly, the conduction characteristic of metal wiring layer 37 is improved.

Further, in the present embodiment, although the Ti layer is used as a glue layer and the TiN layer is used as a barrier metal layer, and TiN layer is used as an anti-reflective coating layer, other material having the same characteristics-with the above can be used.

[Third Embodiment]

Figure 6A:
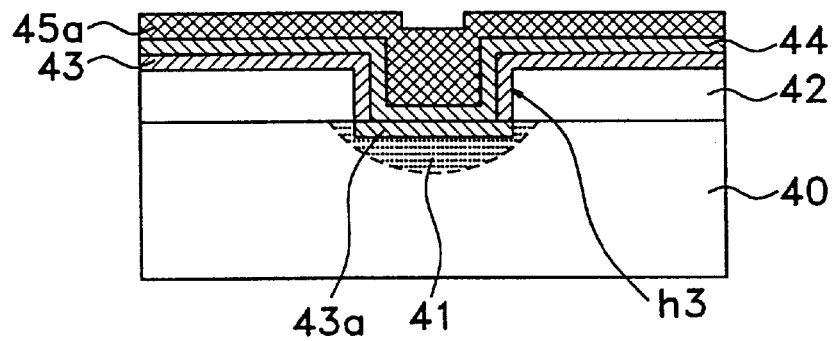
FIGS. 6A to 6E are cross-sectional views for showing the metallization process of semiconductor device according to the third embodiment of the present invention.

As shown in FIG. 6A, a semiconductor substrate 40 of a first conductivity having a second conductivity type junction region 41 is provided. An intermediate insulating layer 42 is deposited on the semiconductor substrate 40 and some portions of the intermediate insulating layer 42 is etched so as to expose a predetermined portion of the junction region 41, thereby forming a contact hole h3. A Ti layer 43 as a glue layer is formed on the intermediate insulating layer 42 and at the bottom and inner surfaces of the contact hole h3 by a know sputtering technology such as the PVD. And then, a first TiN layer 44 as a barrier metal layer for preventing electromigration is formed on the upper of the Ti layer 43. At an interface of the Ti layer 43 and the junction region 41, a titanium silicide layer 43a is formed by the reaction of Ti and Si. A first metal layer 45a of a highly conductive metal such as Al or Cu is deposited on the first TiN layer 44 as a barrier metal layer at thickness half the entire metal layers to be formed later, preferably in the range of 1500 to 5000 Å by a known sputtering technology such as the PVD method.

Figure 6B:
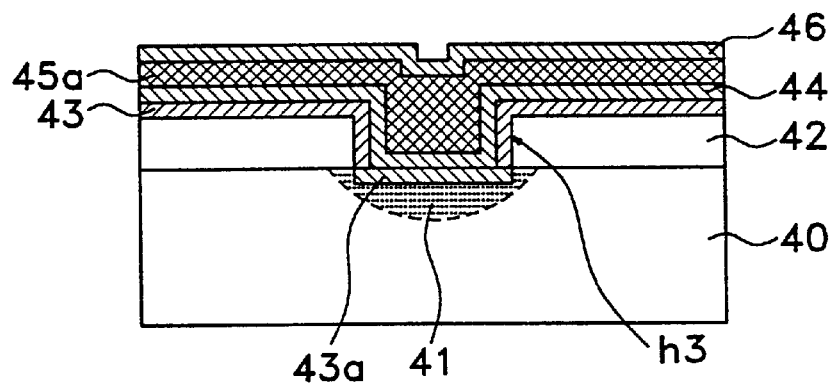

Next, referring to FIG. 6B, an Mg layer 46 as a solid solution layer is deposited on the first metal layer 45a by a sputtering technology such as the PVD method. At this time, the Mg layer 46 is deposited preferably at thickness of approximately 30 to 40% of the entire metal layer to be formed later i.e. in the range of 100 to 300 Å.

Figure 6C:
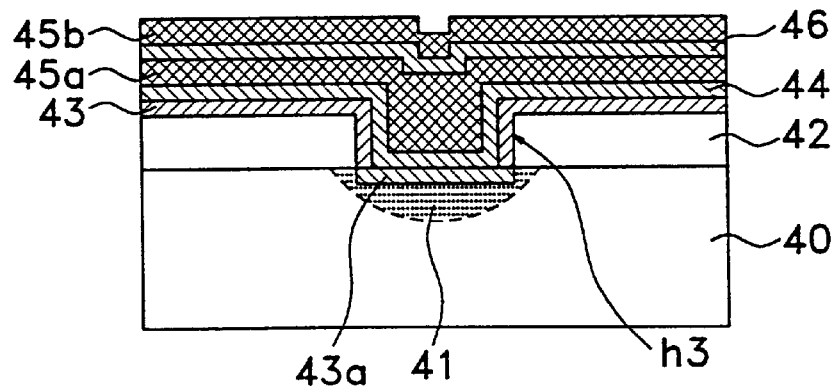

And then, as shown in FIG. 6C, a second metal layer 45b is deposited on the Mg layer 46 by the same method used in the first metal layer 45a. Preferably, the same material with the same thickness as that of the first metal layer 45a is used at the second metal layer 45b.

Figure 6D:
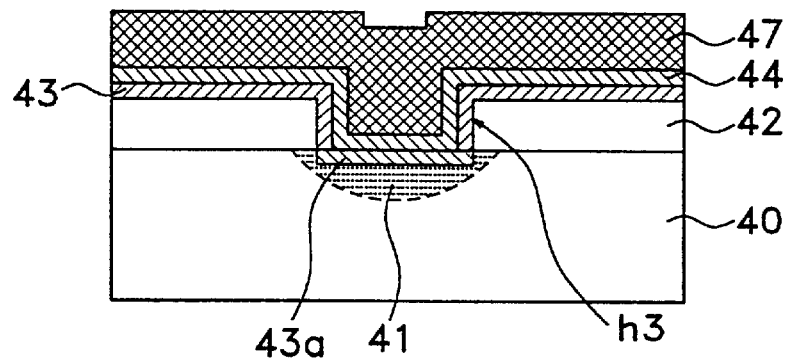

Afterward, as shown in FIG. 6D, as resultant structure is annealed at a predetermined temperature. At this time, as disclosed, when Al is used as the metal layers, the annealing process is performed at the temperature range of 400 to 500° C., and when Cu is used as the metal layers, the annealing process is performed at the temperature range of 650 to 750° C. And then, a metal wiring layer 47 is formed by annealing for melting Mg of the Mg layer 45 to the metal layer 45a and 45b.

Figure 7:
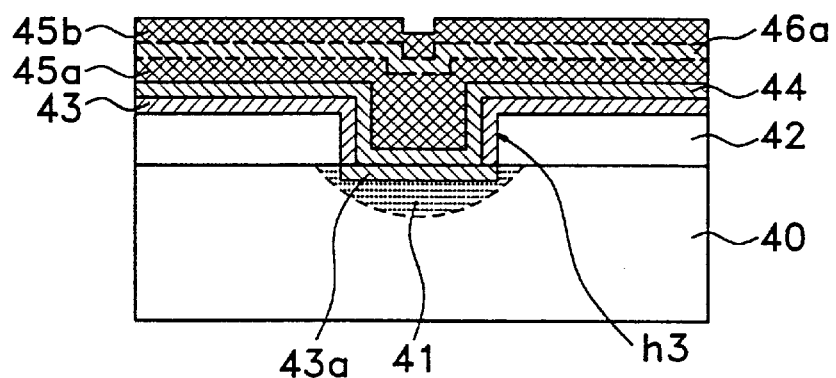
FIG. 7 is a cross-sectional view for showing another metallization process according to one modification of the third embodiment of the present invention.
Figure 8:
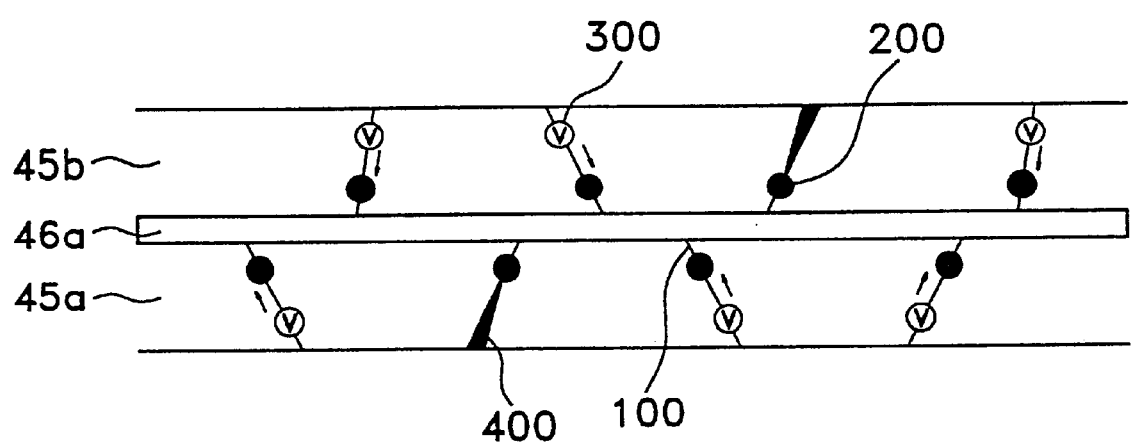
FIG. 8 is an extended cross-sectional view of a metal wiring layer formed according to the third embodiment of the present invention.

At this time, referring to FIG. 7, a remaining layer 46a is formed between the first metal layer 45a and the second metal layer 45b by varying the thickness of the Mg layer 46 and annealing time. At this time, the remaining layer 46a as shown in FIG. 8 prevents the connection of grain boundary 100 between the first metal layer 45a and the second metal layer 45b and accordingly void growing is prevented. Generally, the void 400 is formed by growing electrons along the grain boundary 100. However, in the present embodiment, the grain boundary 100 is disconnected by the remaining layer 46a and the void 400 does not grow. Therefore, the reliability in metallization is improved. Furthermore, when Mg atoms and Al or Cu composing of metal layer are reacted each other, the compounds $MgAl_3$ and $MgCu_2$ 200 are generated. These compounds 200 are precipitated at the grain boundary of the first metal layer 45a and the second metal layer 45b thereby preventing the vacancies' 300 movement which is occurred by the electromigration.

Figure 6E:
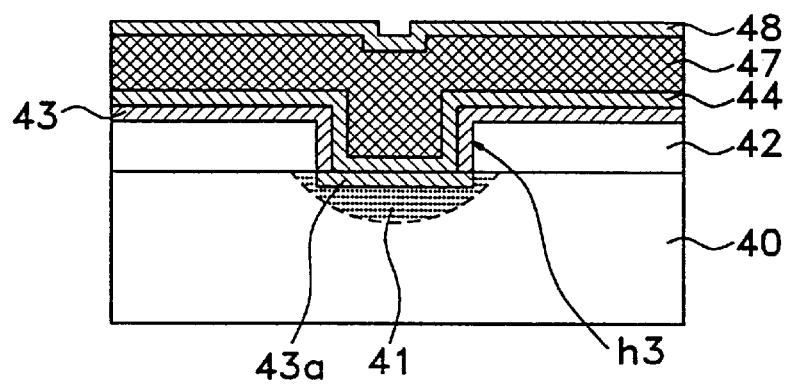

Thereafter, as shown in FIG. 6E, a second TiN layer 48 as an anti-reflective coating layer is deposited on the metal wiring layer 47.

As disclosed in the present embodiment, the same result as that of the first and the second embodiments of the present invention is obtainable even the Mg layer 46 is formed between the metal layers 45a and 45b. Moreover, if there are changes in processing conditions, an Mg-remaining layer 46a may be formed in the metal wiring layer. Therefore, void and vacancies' movement can be prevented easily.

Further, in the present embodiment, although the Ti layer is used as a glue layer and the TiN layer is used as a barrier metal layer, and TiN layer is used as an anti-reflective coating layer, other material having the same characteristics with the above can be used.

As known from the above, an Mg layer is formed at the bottom and upper of a metal layer or therebetween. And next, the Mg layer is melted to a metal layer according to a predetermined annealing process and Mg lowers the melting point of the metal layer thereby increasing the liquidity of the metal layer. Then, the metal wiring is filled up in a fine contact hole without incurring disconnection or void. The compounds generated from the reaction of Mg and the metal layer are also filled up in vacancies. Therefore, vacancies' movement is prevented.

When the Mg layer is disposed between the metal wiring layer, the Mg layer disconnects the grain boundary of the metal layer thereby further restraining the vacancies' movement and void growing.

While the preferred embodiments have been described in detail, and shown in the accompanying drawings, it will be evident that various further modification are possible without departing from the scope of the invention as set forth in the appended claims.

What is claimed is:

1. A metallization process of a semiconductor device comprising the steps of:
   providing a semiconductor substrate having a junction region;
   forming an insulating layer on the upper of the semiconductor substrate;
   forming a contact hole by patterning the insulating layer so as to expose one portion of the junction region;
   forming a glue layer on the upper of the insulating layer, and at the bottom and the inner surfaces of the contact hole;
   forming a barrier metal layer on the glue layer;
   forming a copper layer on the barrier metal layer;
   forming an Mg layer as a solid solution layer on the copper layer; and
   forming a metal wiring layer having more liquidity than that of the copper layer, by annealing the Mg layer to the copper layer at a predetermined temperature.

2. The process as claimed in claim 1, wherein the Mg layer is deposited at thickness of 10% of the copper layer.

3. The process as claimed in claim 1, wherein the copper layer is deposited at thickness of 3000 to 10000 Å.

4. The process as claimed in claim 3, wherein the Mg layer is deposited at thickness of 100 to 300 Å.

5. The process as claimed in claim 1, wherein the step of melting Mg of the Mg layer to the metal layer is an annealing step at a predetermined temperature.

6. The process as claimed in claim 5, wherein the metal layer is an Al layer.

7. The process as claimed in claim 6, wherein the annealing step is performed at temperature of 400 to 500° C.

8. The process as claimed in claim 5, wherein the metal layer is a Cu layer.

9. The process as claimed in claim 1, wherein the annealing step is performed at temperature of 650 to 750° C.

10. The process as claimed in claim 1, wherein the copper layer or the Mg layer is formed according to a physical vapor deposition method.

11. The process as claimed in claim 1, wherein the glue layer is a Ti layer.

12. The process as claimed in claim 1, wherein the barrier metal layer is a TiN layer.

13. The process as claimed in claim 1, further comprising the step of forming an anti-reflective coating layer after the step of forming the metal wiring layer.

14. The process as claimed in claim 13, wherein the anti-reflective coating layer is a TiN layer.

15. A metallization process of a semiconductor device comprising the steps of:
    providing a semiconductor substrate having a junction region;
    forming an insulating layer on the upper of the semiconductor substrate;
    forming a contact hole by patterning the insulating layer so as to expose one portion of the junction region;
    forming a glue layer on the upper of the insulating layer, and at the bottom and inner surfaces of the contact hole;
    forming a barrier metal layer on the glue layer;
    forming a metal layer on the barrier metal layer; and
    forming an Mg layer as a solid solution layer on the metal layer,
    wherein the Mg layer is deposited at a temperature that the Mg is melted to the metal layer in the step of forming the Mg layer.

16. A metallization process of a semiconductor device comprising the steps of:
    providing a semiconductor substrate having a junction region;
    forming an insulating layer on the upper of the semiconductor substrate;
    forming a contact hole by patterning the insulating layer so as to expose one portion of the junction region;
    forming a glue layer on the upper of the insulating layer, and at the bottom and the inner surfaces of the contact hole;
    forming a barrier metal layer on the glue layer;
    forming a first metal layer on the barrier metal layer;
    forming an Mg layer as a solid solution layer on the first metal layer;
    forming a second metal layer on the Mg layer; and
    forming a metal wiring layer having more liquidity than that of the metal layers, by melting the Mg layer to the first and the second metal layers.

17. The process as claimed in claim 16, wherein the Mg layer is deposited at thickness of 10% of the first and second metal layers.

18. The process as claimed in claim 17, wherein the metal layer or the Mg layer is formed according to a physical vapor deposition method.

19. The process as claimed in claim 17, wherein the glue layer is a Ti layer.

20. The process as claimed in claim 17, wherein the barrier metal layer is a TiN layer.

21. The process as claimed in claim 17, further comprising the step of forming an anti-reflective coating layer after the step of forming the metal wiring layer.

22. The process as claimed in claim 21, wherein the anti-reflective coating layer is a TiN layer.

23. The process as claimed in claim 16, wherein the first and second metal layers are deposited at thickness of 1500 to 5000 Å respectively.

24. The process as claimed in claim 23, wherein the Mg layer is deposited at thickness of 100 to 300 Å.

25. The process as claimed in claim 16, wherein the step of melting Mg of the Mg layer to the metal layer is carried out by an annealing step at a selected temperature.

26. The process as claimed in claim 25, wherein the metal layer is an Al layer.

27. The process as claimed in claim 26, wherein the annealing step is performed at temperature of 400 to 500° C.

28. The process as claimed in claim 25, wherein the metal layer is a Cu layer.

29. The process as claimed in claim 28, wherein the annealing step is performed at temperature of 650 to 750° C.

* * * * *